(12) United States Patent
Kim et al.

(10) Patent No.: US 9,583,170 B2
(45) Date of Patent: Feb. 28, 2017

(54) ADJUSTING RESISTIVE MEMORY WRITE DRIVER STRENGTH BASED ON A MIMIC RESISTIVE MEMORY WRITE OPERATION

(71) Applicant: QUALCOMM Incorporated, San Diego, CA (US)

(72) Inventors: Taehyun Kim, Cupertino, CA (US); Jung Pill Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/620,487

(22) Filed: Feb. 12, 2015

(65) Prior Publication Data

US 2016/0240237 A1   Aug. 18, 2016

(51) Int. Cl.
*G11C 11/00* (2006.01)
*G11C 11/16* (2006.01)
*G11C 13/00* (2006.01)

(52) U.S. Cl.
CPC .. *G11C 11/1675* (2013.01); *G11C 2013/0078* (2013.01)

(58) Field of Classification Search
CPC ............... G11C 11/1675; G11C 2013/0078
USPC .. 365/157, 158, 163, 171, 173, 210.14, 225, 365/242
See application file for complete search history.

(56) References Cited

U.S. PATENT DOCUMENTS

| | | | |
|---|---|---|---|
| 7,333,360 B2 | 2/2008 | DeHerrera et al. | |
| 8,184,476 B2 | 5/2012 | Nahas et al. | |
| 8,344,433 B2 | 1/2013 | Zhu et al. | |
| 8,693,273 B2 | 4/2014 | Yuh et al. | |
| 2004/0027854 A1* | 2/2004 | Iwata | G11C 11/16 365/158 |
| 2009/0237988 A1* | 9/2009 | Kurose | G11C 11/16 365/171 |
| 2010/0085799 A1 | 4/2010 | Cho et al. | |
| 2010/0290280 A1* | 11/2010 | Seo | G11C 7/062 365/171 |
| 2011/0157966 A1 | 6/2011 | Lee | |

(Continued)

OTHER PUBLICATIONS

International Search Report and Written Opinion for PCT/US2016/014689, mailed Apr. 4, 2016, 11 pages.

*Primary Examiner* — Tha-O H Bui
(74) *Attorney, Agent, or Firm* — Withrow & Terranova, PLLC

(57) ABSTRACT

Aspects of adjusting resistive memory write driver strength based on a mimic resistive memory write operation are disclosed. In one aspect, a write driver adjustment circuit is provided to adjust a write current provided by a write driver to a resistive memory for write operations. The write driver adjustment circuit includes a mimic write driver configured to provide a mimic write current that mimics the write current provided to the resistive memory. The mimic write current is applied to a mimic resistive memory that contains mimic resistive memory elements that mimic a resistance distribution of the resistive memory. When the mimic write current is applied, a mimic voltage is generated across the mimic resistive memory elements. The write driver adjustment circuit is configured to adjust the write current based on the mimic voltage so that the write current is sufficient for write operations, but low enough to reduce breakdown.

26 Claims, 11 Drawing Sheets

(56) References Cited

U.S. PATENT DOCUMENTS

2013/0314129 A1   11/2013  Yao et al.
2014/0104925 A1*  4/2014  Azuma ................ G11C 13/004
                                                               365/148
2014/0119094 A1*  5/2014  Lee ...................... G11C 13/004
                                                               365/148
2014/0146600 A1    5/2014  Sohn et al.

* cited by examiner

ADJUSTING RESISTIVE MEMORY WRITE DRIVER STRENGTH BASED ON A MIMIC RESISTIVE MEMORY WRITE OPERATION

BACKGROUND

I. Field of the Disclosure

The technology of the disclosure relates generally to resistive memory, and particularly to resistive memory write driver circuits for providing write currents to resistive memory to perform write operations.

II. Background

Processor-based computer systems include memory for data storage. Memory systems are composed of memory bitcells capable of storing data, wherein the form of the stored data depends on the type of memory employed. In particular, magnetic random access memory (MRAM) is an example of non-volatile memory in which data is stored by programming a magnetic tunnel junction (MTJ) of an MRAM bitcell. Data is stored in an MTJ as a magnetic state, wherein no electric current is required to preserve a stored data value. Thus, an MTJ can store data even when power is not supplied to the MTJ. Conversely, memory that stores data in the form of an electric charge, such as a static random access memory (SRAM), requires power to preserve a stored data value. Thus, because an MTJ may store information even when power is turned off, particular circuits and systems may benefit from employing MRAM.

In this regard, FIG. 1 illustrates an exemplary MRAM bitcell 100 that includes a metal-oxide semiconductor (typically n-type MOS, i.e., NMOS) access transistor 102 integrated with an MTJ 104 for storing non-volatile data. The MRAM bitcell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientation of the pinned and free layers 106, 108 are anti-parallel (AP) to each other, a first memory state exists (e.g., a logical '1'). When the magnetic orientation of the pinned and free layers 106, 108 are parallel (P) to each other, a second memory state exists (e.g., a logical '0'). Further, the access transistor 102 controls reading and writing data to the MTJ 104. A drain (D) of the access transistor 102 is coupled to a bottom electrode 112 of the MTJ 104, which is coupled to the pinned layer 106. A word line 114 is coupled to a gate (G) of the access transistor 102. A source (S) of the access transistor 102 is coupled to a source line 116, which is coupled to a write driver 118. A bit line 120 is coupled to the write driver 118 and a top electrode 122 of the MTJ 104, which is coupled to the free layer 108.

With continuing reference to FIG. 1, when writing data to the MTJ 104, the gate G of the access transistor 102 is activated by activating the word line 114, which couples a write current ($I_W$) from the write driver 118 on the source line 116 to the bottom electrode 112. The write current ($I_W$) provided by the write driver 118 to the MTJ 104 must be strong enough to change the magnetic orientation of the free layer 108. If the magnetic orientation is to be changed from AP to P, a current flowing from the top electrode 122 to the bottom electrode 112 induces a spin transfer torque (STT) at the free layer 108 that can change the magnetic orientation of the free layer 108 to P with respect to the pinned layer 106. If the magnetic orientation is to be changed from P to AP, a current flowing from the bottom electrode 112 to the top electrode 122 induces an STT at the free layer 108 to change the magnetic orientation of the free layer 108 to AP with respect to the pinned layer 106.

Because the MTJ 104 is a resistive memory element with a given resistance (R(mtj)), applying the write current ($I_W$) to the MTJ 104 during a write operation will generate voltage (V(mtj)) across the MTJ 104 according to V(mtj)= $I_W$*R(mtj). However, the write current ($I_W$) should not exceed a defined current level for the MTJ 104, because the MTJ 104 will incur electrical breakdown if the V(mtj) generated across the MTJ 104 exceeds a certain breakdown voltage (V(bd)). The MTJ 104 is unable to function as a resistive memory element while in a breakdown state. As the tunnel barrier 110 of the MTJ 104 becomes thinner, breakdown of the MTJ 104 occurs at a lower breakdown voltage (V(bd)). Due to process, voltage, and temperature (PVT) variations that can occur during MTJ fabrication, multiple MTJs of the same design and fabrication process may have varying resistance levels R(mtj). Thus, applying the given write current ($I_W$) to MTJs in an MRAM could cause certain MTJs with higher resistances due to process variation to breakdown as a result of generating the breakdown voltage (V(bd)), while other MTJs of the same design with lower resistances would not breakdown.

In this regard, FIG. 2 is a graph 200 illustrating how process variations in MTJ fabrication in an MRAM can cause voltage distributions that may cause certain MTJs to incur breakdown for a given write current ($I_W$). In this regard, the graph 200 in FIG. 2 includes a lower voltage distribution (V(mtj_low)) for MTJs in an MRAM that receive the write current ($I_W$) and that have a lower resistance (R(mtj_low)) as a result of the MTJ fabrication process (i.e., V(mtj_low)=$I_W$*R(mtj_low)). The graph 200 also includes a higher voltage distribution (V(mtj_high)) of MTJs in the MRAM that receive the write current ($I_W$) and that have a higher resistance (R(mtj_high)) as a result of the MTJ fabrication process (i.e., V(mtj_high)=$I_W$*R (mtj_high)). A breakdown voltage distribution (V(bd)) is also shown in the graph 200 in FIG. 2 as the voltage distribution in which breakdown can occur in the MTJs. Notably, the higher voltage distribution (V(mtj_high)) in FIG. 2 is shown as overlapping with the breakdown voltage distribution (V(bd)) in a breakdown overlap region 202. The breakdown overlap region 202 illustrates that certain MTJs within the high voltage distribution (V(mtj_high)) have a high enough resistance (R(mtj_high)) caused by fabrication processes to generate a voltage across the MTJ V(mtj)) as a result of receiving the write current ($I_W$), to exceed the breakdown voltage V(bd), thus resulting in failed write operations. Therefore, it would be advantageous to provide write current to MTJs in an MRAM so as to avoid or reduce electrical breakdown to avoid or reduce write failures.

SUMMARY OF THE DISCLOSURE

Aspects disclosed in the detailed description include adjusting resistive memory write driver strength based on a mimic resistive memory write operation. Related methods and systems are also disclosed. In one aspect, a write driver adjustment circuit is provided to adjust a write current provided by a write driver to a resistive memory for write operations. The write driver adjustment circuit includes a mimic write driver. The mimic write driver is configured to provide a mimic write current that mimics the write current provided to the resistive memory by the write driver. The mimic write current is applied to a mimic resistive memory that contains mimic resistive memory elements that mimic a resistance distribution of resistive memory elements in the resistive memory. Thus, when the mimic write current is applied to the mimic resistive memory, a mimic voltage is generated across the mimic resistive memory elements. The mimic voltage mimics a voltage that would be generated across the resistive memory elements in the resistive memory if the same mimic write current were applied to the resistive memory. A write driver control circuit is included that is configured to adjust the write current applied to the resistive memory by the write driver based on the mimic voltage. In this manner, the write driver adjustment circuit is configured to adjust the write current applied to the resistive memory to a sufficient level to properly change the magnetization in the resistive memory elements of the resistive memory for write operations, but low enough to reduce or avoid breakdown in the resistive memory elements.

In this regard in one aspect, a write driver adjustment circuit for adjusting a write current for a resistive memory is disclosed. The write driver adjustment circuit comprises a mimic write driver circuit configured to provide a mimic write current mimicking a write current provided by a write driver to a resistive memory. The write driver adjustment circuit further comprises a mimic resistive memory having a mimic resistance corresponding to a resistance of the resistive memory. The write driver adjustment circuit further comprises a write driver control circuit. The write driver control circuit is configured to determine a mimic voltage generated across the mimic resistive memory when the mimic write current is provided to the mimic resistive memory. The write driver control circuit is further configured to compare the determined mimic voltage to a threshold voltage, and adjust the write current provided by the write driver to the resistive memory based on the comparison of the mimic voltage to the threshold voltage.

In another aspect, a write driver adjustment circuit for adjusting a write current for a resistive memory is disclosed. The write driver adjustment circuit comprises a means for providing a mimic write current that mimics a write current provided by a write driver to a resistive memory to a mimic resistive memory to perform a mimic write operation. The write driver adjustment circuit further comprises a means for determining a mimic voltage generated across the mimic resistive memory in response to the mimic resistive memory receiving the mimic write current. The write driver adjustment circuit further comprises a means for comparing the mimic voltage to a threshold voltage. The write driver adjustment circuit further comprises a means for adjusting the write current provided by the write driver based on comparing the mimic voltage to the threshold voltage.

In another aspect, a method of adjusting a write driver current to reduce a breakdown failure rate of a corresponding resistive memory system is disclosed. The method comprises providing a mimic write current that mimics a write current provided by a write driver to a resistive memory to a mimic resistive memory. The method further comprises determining a mimic voltage generated across the mimic resistive memory in response to the mimic resistive memory receiving the mimic write current. The method further comprises comparing the mimic voltage to a threshold voltage. The method further comprises adjusting the write current provided by the write driver based on comparing the mimic voltage to the threshold voltage.

In another aspect, a magnetic random access memory (MRAM) system is disclosed. The MRAM system comprises an MRAM memory. The MRAM system further comprises a write driver configured to provide a write current to the MRAM memory. The MRAM system further comprises a write driver adjustment circuit. The write driver adjustment circuit comprises a mimic write driver circuit configured to provide a mimic write current mimicking the write current. The write driver adjustment circuit further comprises a mimic resistive memory having a mimic resistance corresponding to a resistance of the MRAM memory. The write driver adjustment circuit further comprises a write driver control circuit. The write driver control circuit is configured to determine a mimic voltage generated across the mimic resistive memory when the mimic write current is provided to the mimic resistive memory. The write driver control circuit is further configured to compare the mimic voltage to a threshold voltage, and adjust the write current provided by the write driver to the MRAM memory based on comparing the mimic voltage to the threshold voltage.

DETAILED DESCRIPTION

Figure 1:
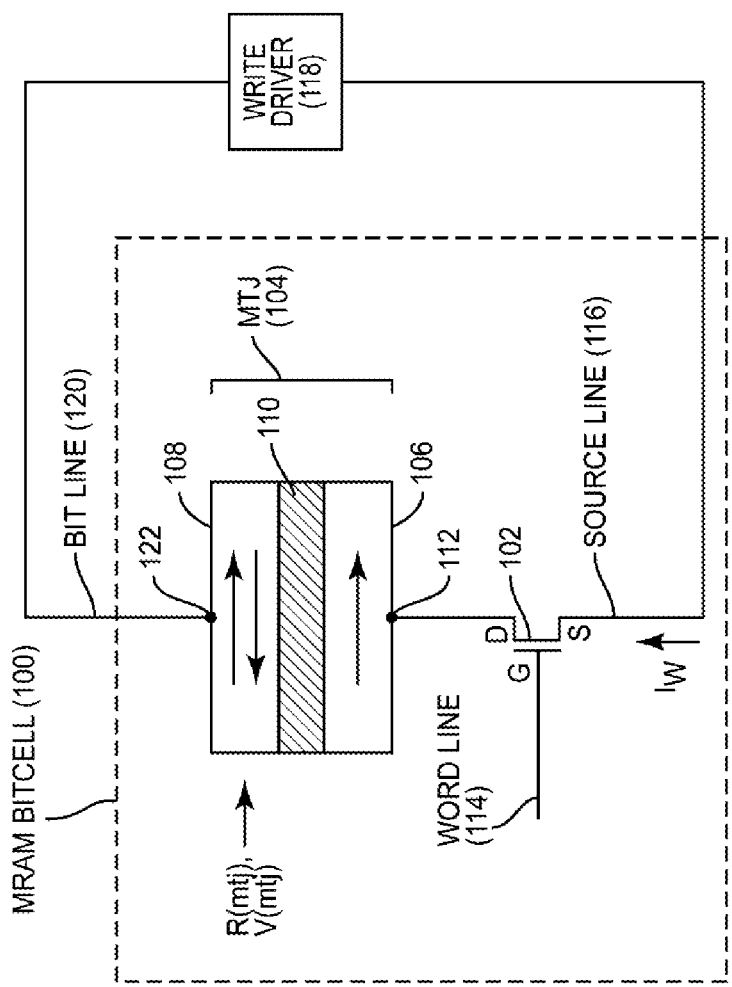
FIG. 1 is a diagram of an exemplary magnetic random access memory (MRAM) bitcell employing a magnetic tunnel junction (MTJ), and a write driver configured to write data into the MRAM bitcell.
Figure 2:
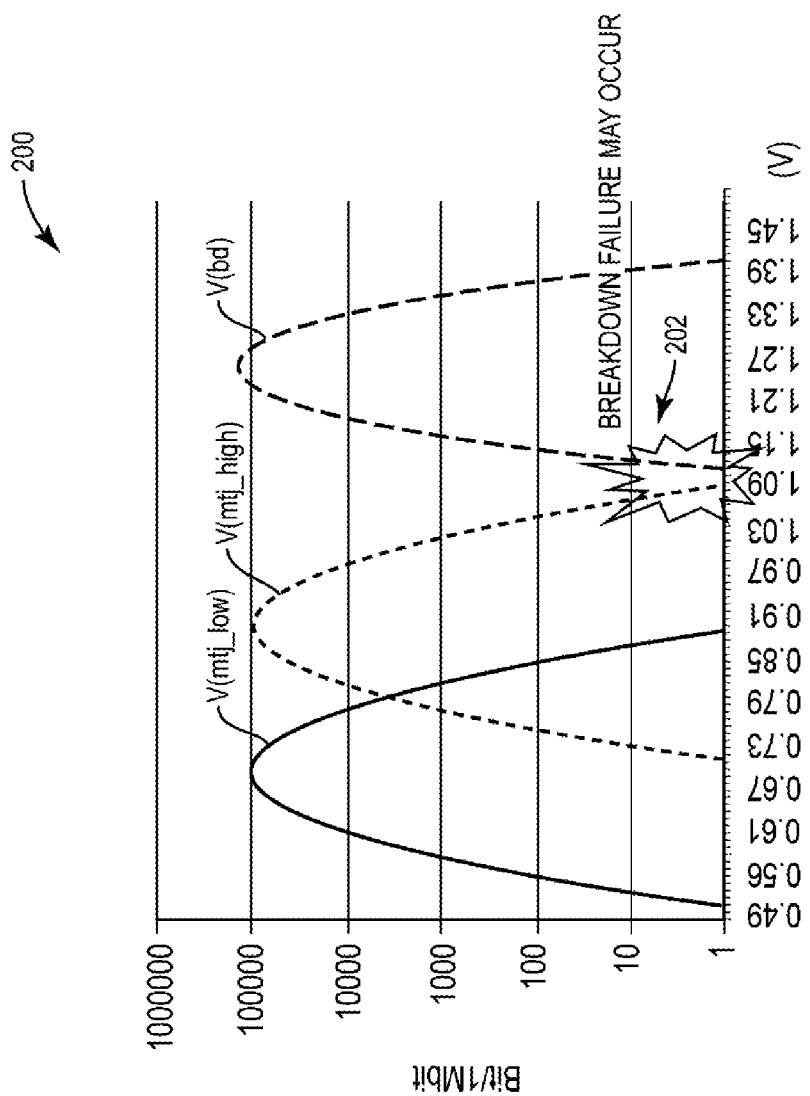
FIG. 2 is a graph illustrating a high voltage distribution (V(mtj_high)) and a low voltage distribution (V(mtj_low)) of exemplary MTJs in an MRAM due to manufacturing process variations as compared to a breakdown voltage distribution (V(bd)) of the MTJs.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include adjusting resistive memory write driver strength based on a mimic resistive memory write operation. Related methods and systems are also disclosed. In one aspect, a write driver adjustment circuit is provided to adjust a write current provided by a write driver to a resistive memory for write operations. The write driver adjustment circuit includes a mimic write driver. The mimic write driver is configured to provide a mimic write current that mimics the write current provided to the resistive memory by the write driver. The mimic write current is applied to a mimic resistive memory that contains mimic resistive memory elements that mimic a resistance distribution of resistive memory elements in the resistive memory. Thus, when the mimic write current is applied to the mimic resistive memory, a mimic voltage is generated across the mimic resistive memory elements. The mimic voltage mimics a voltage that would be generated across the resistive memory elements in the resistive memory if the same mimic write current were applied to the resistive memory. A write driver control circuit is included that is configured to adjust the write current applied by the write driver to the resistive memory based on the mimic voltage. In this manner, the write driver adjustment circuit is configured to adjust the write current applied to the resistive memory to a sufficient level to properly change the magnetization in the resistive memory elements of the resistive memory for write operations, but low enough to reduce or avoid breakdown in the resistive memory elements.

Figure 3:
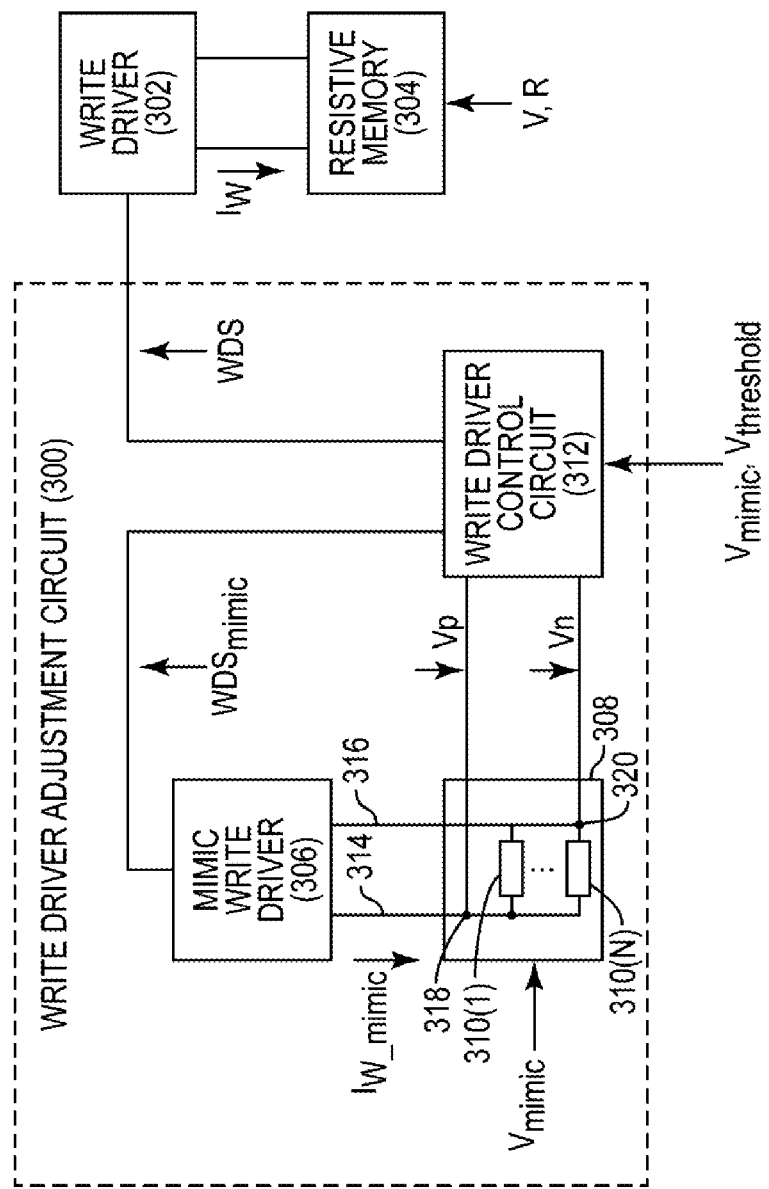
FIG. 3 is a block diagram of an exemplary write driver adjustment circuit configured to adjust a write current ($I_W$) provided by a write driver to a resistive memory to write data based on a mimic write operation performed in a mimic resistive memory so as to reduce write failures in the resistive memory due to breakdown.

In this regard, FIG. 3 illustrates an exemplary write driver adjustment circuit 300 configured to adjust a write current ($I_W$) provided by a write driver 302 to a resistive memory 304 based on a mimic write operation. Adjusting the write current ($I_W$) may reduce write failures of the resistive memory 304 due to breakdown. More specifically, the write driver adjustment circuit 300 includes a mimic write driver 306. The mimic write driver 306 is configured to provide a mimic write current ($I_{W\_mimic}$) to a mimic resistive memory 308, wherein the mimic write current ($I_{W\_mimic}$) mimics the write current ($I_W$) provided by the write driver 302. The mimic resistive memory 308 contains one or more mimic resistive memory elements 310(1)-310(N) that each have a mimic resistance ($R_{mimic}$) (not shown) that mimics a resistance (R) or resistance distribution (not shown) of resistive memory elements in the resistive memory 304. Thus, when the mimic write current ($I_{W\_mimic}$) is applied to the mimic resistive memory 308, a mimic voltage ($V_{mimic}$) is generated across the mimic resistive memory 308. The mimic voltage ($V_{mimic}$) mimics a voltage (V) that would be generated across the resistive memory elements in the resistive memory 304 if the same mimic write current ($I_{W\_mimic}$) were applied to the resistive memory 304. A write driver control circuit 312 is configured to adjust the write current ($I_W$) applied to the resistive memory 304 based on the mimic voltage ($V_{mimic}$). In this manner, the write driver adjustment circuit 300 is configured to adjust the write current ($I_W$) applied to the resistive memory 304 to a current level low enough to reduce or avoid breakdown in the resistive memory elements.

With continuing reference to FIG. 3, the mimic write current ($I_{W\_mimic}$) is provided to the mimic resistive memory 308 as a result of voltages applied to a mimic bit line 314 and a mimic source line 316, generating the mimic voltage ($V_{mimic}$) across the mimic resistive memory 308. Notably, the mimic voltage ($V_{mimic}$) mimics the voltage (V) that would be generated across a corresponding resistive memory element in the resistive memory 304 if the mimic write current ($I_{W\_mimic}$) were applied to the resistive memory 304. The write driver control circuit 312 is configured to determine the mimic voltage ($V_{mimic}$) generated when the mimic write current ($I_{W\_mimic}$) is provided to the mimic resistive memory 308. The write driver control circuit 312 is also configured to compare the mimic voltage ($V_{mimic}$) to a threshold voltage ($V_{threshold}$). Based on this comparison, the write driver control circuit 312 is configured to adjust the write current ($I_W$). To ensure that the mimic write current ($I_{W\_mimic}$) provided by the mimic write driver 306 continues to accurately mimic the write current ($I_W$), the write driver control circuit 312 is configured to correspondingly adjust the mimic write current ($I_{W\_mimic}$) upon adjusting the write current ($I_W$). Further, in this aspect, the write driver control circuit 312 is configured to adjust the write current ($I_W$) and the mimic write current ($I_{W\_mimic}$) by providing a write driver strength control signal (WDS) and a mimic write driver strength control signal ($WDS_{mimic}$) to the writer driver 302 and the mimic write driver 306, respectively. In this manner, the write driver adjustment circuit 300 is configured to adjust the write current ($I_W$) applied to the resistive memory 304 to a current level low enough to reduce or avoid breakdown in the resistive memory elements.

Notably, the aspect described in FIG. 3 is configured to adjust the write current ($I_W$) to reduce or avoid breakdown in the resistive memory elements. However, other aspects may be configured to adjust the write current ($I_W$) to provide a current level sufficient to perform write operations in the resistive memory elements and low enough to reduce or avoid breakdown. In such aspects, the mimic voltage ($V_{mimic}$) is equal to a difference of a first voltage ($V_p$) at a first node 318 and a second voltage ($V_n$) at a second node 320 (i.e., mimic voltage ($V_{mimic}$)=first voltage ($V_p$)−second voltage ($V_n$)). The write driver control circuit 312 in such aspects is configured to compare the mimic voltage ($V_{mimic}$) to the threshold voltage ($V_{threshold}$), wherein the threshold voltage ($V_{threshold}$) is equal to a range of voltages. Specifically, the threshold voltage ($V_{threshold}$) is equal to a value less than or equal to a maximum threshold voltage ($V_{max\_threshold}$), and greater than or equal to a minimum threshold voltage ($V_{min\_threshold}$). Based on this comparison, the write driver control circuit 312 is configured to adjust the write current ($I_W$). Specifically in such aspects, the write driver control circuit 312 is configured to decrease the write current ($I_W$) if the mimic voltage ($V_{mimic}$) is greater than the maximum threshold voltage ($V_{max\_threshold}$) and increase the write current ($I_W$) if the mimic voltage ($V_{mimic}$) is less than the minimum threshold voltage ($V_{min\_threshold}$). Further, as described in more detail below, the write driver control circuit 312 in some aspects is configured to update the write current ($I_W$) of the write driver 302 with an adjusted value only when the resistive memory 304 is in an idle state, so as not to interfere with active write operations.

Figure 4:
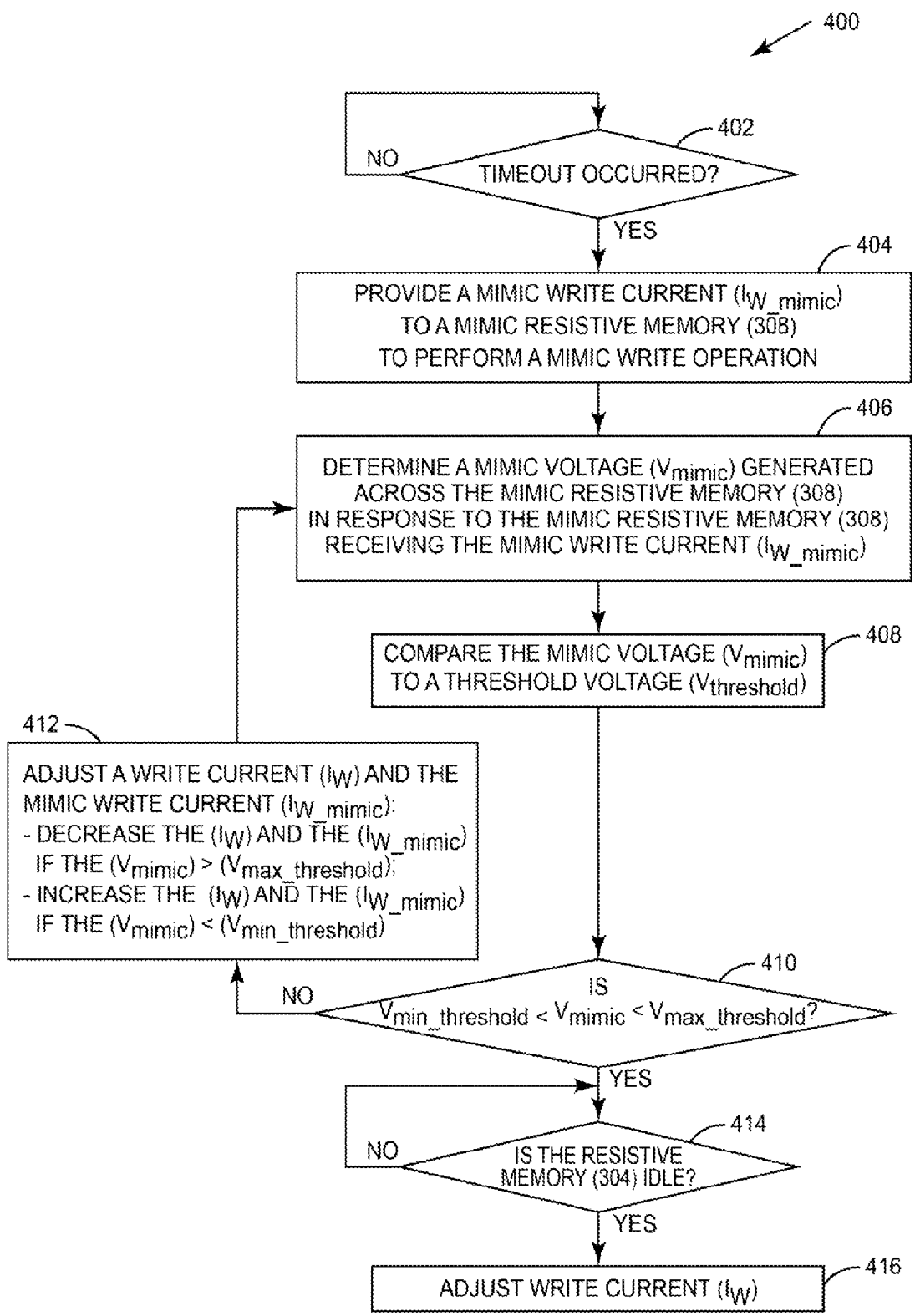
FIG. 4 is a flowchart of an exemplary process employed by the write driver adjustment circuit of FIG. 3 to adjust the write current ($I_W$) provided by the write driver based on the mimic write operation performed in the mimic resistive memory so as to reduce write failures in the resistive memory due to breakdown.

In this regard, FIG. 4 illustrates an exemplary process 400 that can be employed by the write driver adjustment circuit 300 of FIG. 3 to adjust the write current ($I_W$) provided by the write driver 302 to the resistive memory 304 based on a mimic write operation. With reference to FIG. 4, the write driver adjustment circuit 300 determines whether a timeout has occurred (block 402). More specifically, the write driver adjustment circuit 300 periodically determines whether the write current ($I_W$) should be adjusted. If a timeout has not occurred at block 402, the write driver adjustment circuit 300 continues to check for when a timeout has occurred. Upon a timeout occurring, the mimic write driver 306 in FIG. 3 provides the mimic write current ($I_{W\_mimic}$) to the mimic resistive memory 308 to perform a mimic write operation (block 404). The write driver control circuit 312 determines the mimic voltage ($V_{mimic}$) (i.e., mimic voltage ($V_{mimic}$)=first voltage ($V_p$)–second voltage ($V_n$)) generated across the mimic resistive memory 308 in response to the mimic resistive memory 308 receiving the mimic write current ($I_{W\_mimic}$) (block 406).

With continuing reference to FIG. 4, the write driver control circuit 312 compares the mimic voltage ($V_{mimic}$) to the threshold voltage ($V_{threshold}$) (block 408). In particular, in this example, the write driver control circuit 312 determines whether the mimic voltage ($V_{mimic}$) is less than the maximum threshold voltage ($V_{max\_threshold}$) and greater than the minimum threshold voltage ($V_{min\_threshold}$) (i.e., $V_{min\_threshold} \leq V_{mimic} \leq V_{max\_threshold}$) (block 410). If the mimic voltage ($V_{mimic}$) does not satisfy the conditions in block 410, the write driver control circuit 312 adjusts the write current ($I_W$) and the mimic write current ($I_{W\_mimic}$) so that the write current ($I_W$) and the mimic write current ($I_{W\_mimic}$) are at a level sufficient to perform write operations, without causing breakdown in the resistive memory 304 and the mimic resistive memory 308, respectively (block 412). More specifically, the write driver control circuit 312 decreases the write current ($I_W$) and the mimic write current ($I_{W\_mimic}$) in block 412 if the mimic voltage ($V_{mimic}$) is greater than the maximum threshold voltage ($V_{max\_threshold}$). Conversely, the write driver control circuit 312 increases the write current ($I_W$) and the mimic write current ($I_{W\_mimic}$) in block 412 if the mimic voltage ($V_{mimic}$) is less than the minimum threshold voltage ($V_{min\_threshold}$). In this manner, the write current ($I_W$) and the mimic write current ($I_{W\_mimic}$) are adjusted to levels sufficient to perform write operations in the resistive memory 304 and the mimic resistive memory 308, respectively, but low enough to reduce or avoid breakdown.

With continuing reference to FIG. 4, following an adjustment of the write current ($I_W$) and the mimic write current ($I_{W\_mimic}$), the write driver control circuit 312 again determines the updated mimic voltage ($V_{mimic}$) at block 406 generated with the adjusted mimic write current ($I_{W\_mimic}$). In this manner, the write driver control circuit 312 iteratively determines and adjusts the write current ($I_W$) and the mimic write current ($I_{W\_mimic}$) until the mimic voltage ($V_{mimic}$) satisfies the conditions in block 410.

With continuing reference to FIG. 4, in this aspect, when the mimic voltage ($V_{mimic}$) satisfies the conditions in block 410, the write driver control circuit 312 determines whether the resistive memory 304 is in an idle state (block 414). If the resistive memory 304 is not in an idle state (i.e., if it is performing a read or write operation), the write driver adjustment circuit 300 continues to check the status of the resistive memory 304 until the resistive memory 304 enters the idle state. Upon the resistive memory 304 entering the idle state, the write driver control circuit 312 updates the write current ($I_W$) provided by the write driver 302 so as to reflect the adjustment(s) performed in block 412 (block 416). In other words, the write driver adjustment circuit 300 calculates an adjusted write current ($I_W$) when the resistive memory 304 is active, but waits for the resistive memory 304 to complete any operations in progress before updating the write current ($I_W$). Thus, the write driver adjustment circuit 300 adaptively adjusts the write current ($I_W$) to a current level sufficient to perform write operations, but low enough to reduce or avoid breakdown in the resistive memory elements without interfering with the operation of the resistive memory 304.

Figure 5:
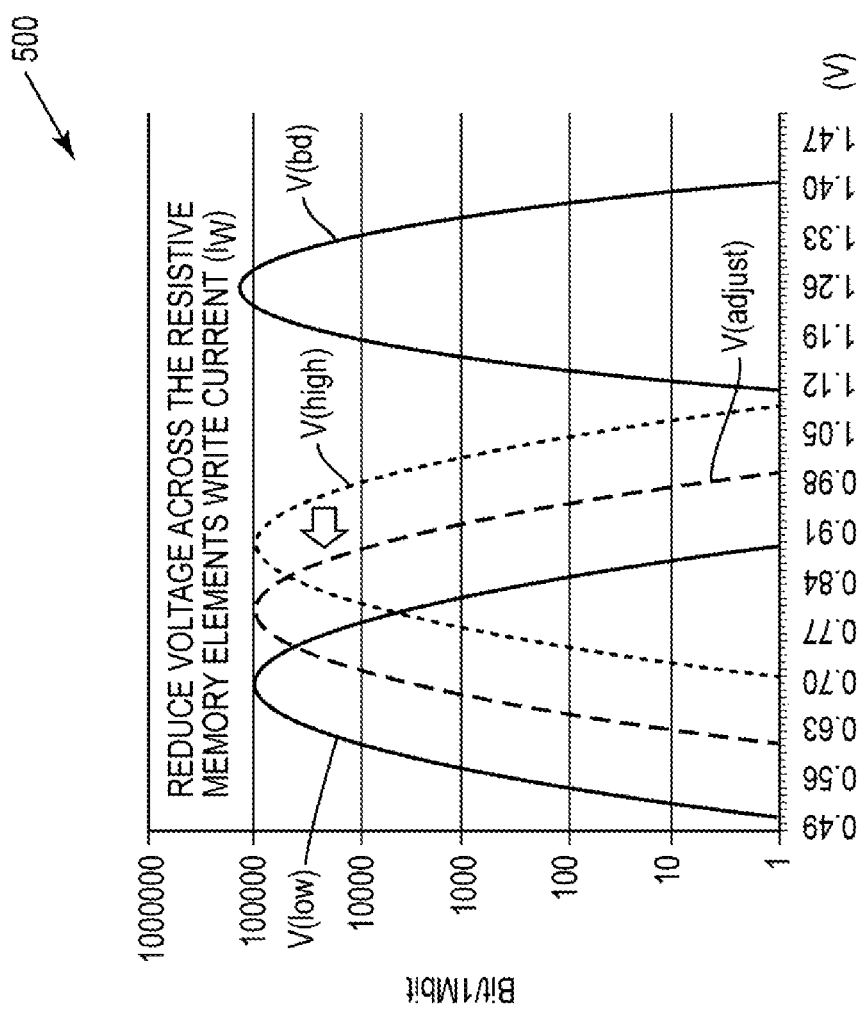
FIG. 5 is a graph illustrating a high voltage distribution (V(high)) and a low voltage distribution (V(low)) of exemplary resistive memory elements in the resistive memory of FIG. 3 due to manufacturing process variations as compared to an adjusted voltage distribution (V(adjust)) and the breakdown voltage (V(bd)) of the resistive memory elements.

In this regard, FIG. 5 is a graph 500 illustrating how the write driver adjustment circuit 300 may adjust a maximum voltage across the resistive memory elements in the resistive memory 304 by employing the process 400 of FIG. 4, thereby reducing write fails due to electrical breakdown. In particular, the graph 500 includes a lower voltage distribution (V(low)) for resistive memory elements in the resistive memory 304 that have a lower resistance (R(low)) as a result of fabrication processes (i.e., V(low)=$I_W$*R(low)). The graph 500 also includes a higher voltage distribution (V(high)) of resistive memory elements in the resistive memory 304 that have a higher resistance (R(high)) as a result of fabrication processes. A breakdown voltage distribution (V(bd)) is also shown in the graph 500 as the voltage distribution in which breakdown can occur as a result of the write current ($I_W$) combining with a resistance (R) of a certain resistive memory element in the resistive memory 304.

With continuing reference to FIG. 5, when the write driver adjustment circuit 300 employs the process 400 in FIG. 4, the resistive memory elements corresponding to the higher voltage distribution (V(high)) generate an adjusted voltage distribution (V(adjust)) in response to receiving the adjusted write current ($I_W$). More specifically, because the write current ($I_W$) is decreased if the mimic voltage ($V_{mimic}$) is greater than the maximum threshold voltage ($V_{max\_threshold}$), the adjusted voltage distribution (V(adjust)) generated by the corresponding resistive memory elements is reduced as compared to the higher voltage distribution (V(high)) (i.e., V(adjust)=adjusted $I_W$*R(high), which is less than V(high)= $I_W$*R(high)). Because the write current ($I_W$) is adjusted so that the mimic voltage ($V_{mimic}$) is less than the maximum threshold voltage ($V_{max\_threshold}$) and greater than the minimum threshold voltage ($V_{min\_threshold}$), the resistive memory elements in the resistive memory 304 will generate voltages in the lower voltage distribution (V(low)) and the adjusted voltage distribution (V(adjust)), thus avoiding the breakdown voltage distribution (V(bd)). Therefore, the graph 500 illustrates that the write driver adjustment circuit 300 in FIG. 3 may adjust the write current ($I_W$) to a level sufficient to properly change the magnetization in the resistive memory elements of the resistive memory 304 for write operations, but low enough to reduce or avoid breakdown.

Figure 6:
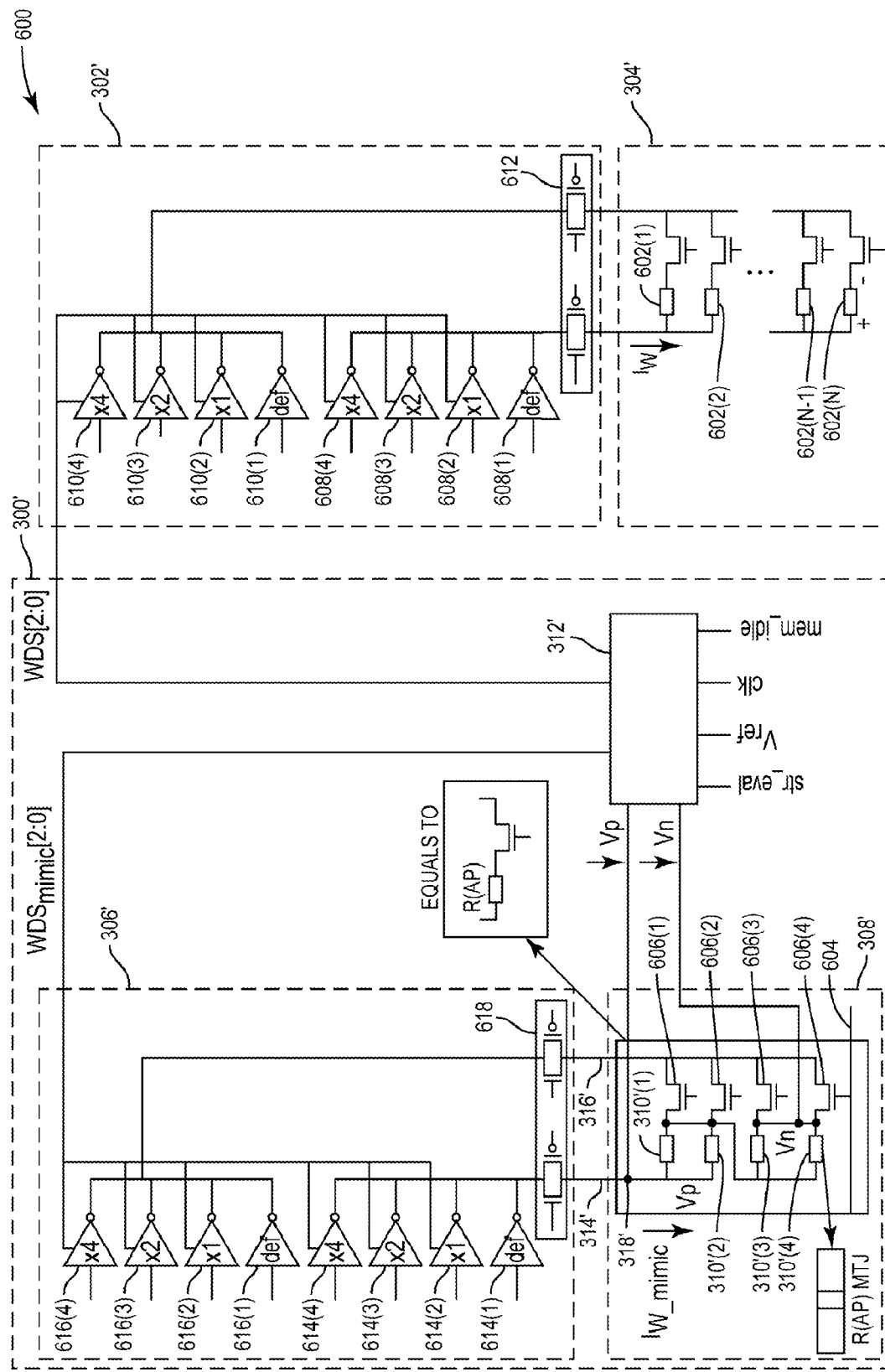
FIG. 6 is a circuit diagram of another exemplary write driver adjustment circuit configured to adjust a write current ($I_W$) provided by a write driver to an MRAM to write data based on a mimic write operation performed in a mimic MRAM so as to reduce write failures of the MRAM due to breakdown.

While the write driver adjustment circuit 300 in FIG. 3 provides details of one aspect disclosed herein, other aspects are now described. In this regard, FIG. 6 illustrates a resistive memory system 600 employing a write driver adjustment circuit 300' similar to the write driver adjustment circuit 300 of FIG. 3. The write driver adjustment circuit 300' is configured to adjust the write current ($I_W$) provided by a write driver 302' to a resistive memory 304' based on a mimic write operation, to properly change the magnetization in the resistive memory elements of the resistive memory 304' for write operations, but low enough to reduce or avoid breakdown. By adjusting the write current ($I_W$) in this manner, write failures caused by a breakdown voltage (V(bd)) being present across one of a plurality of resistive memory elements 602(1)-602(N) in the resistive memory 304' during a write operation may be reduced. In this aspect, the resistive memory 304' is a magnetic random access memory (MRAM) memory, wherein the resistive memory elements 602(1)-602(N) are magnetic tunneling junctions (MTJs). However, other aspects may employ other types of resistive memory and resistive memory elements to achieve similar functionality.

With continuing reference to FIG. 6, the write driver adjustment circuit 300' includes a mimic resistive memory 308' (i.e., a mimic MRAM) employing mimic resistive memory elements 310'(1)-310'(4) (i.e., mimic MTJs). The mimic resistive memory elements 310'(1)-310'(4) are configured so that a total mimic resistance ($R_{total\_mimic}$) of the mimic resistive memory 308' is approximately equal to an average resistance of all the mimic resistive memory elements 310'(1)-310'(4). Specifically, in this aspect, the mimic resistive memory elements 310'(1), 310'(2) are connected in parallel, as are the mimic resistive memory elements 310'(3), 310'(4). The parallel pair of mimic resistive memory elements 310'(1), 310'(2) is connected in series to the parallel pair of mimic resistive memory elements 310'(3), 310'(4). Such a connection scheme is one approach in which the mimic resistive memory elements 310'(1)-310'(4) may be connected so as to produce the total mimic resistance ($R_{total\_mimic}$) that equals the average resistance of the mimic resistive memory elements 310'(1)-310'(4). Further, while this aspect includes four (4) mimic resistive memory elements 310'(1)-310'(4), other aspects may include an N number of mimic resistive memory elements 310'(1)-310'(N) to achieve similar functionality. As the number of mimic resistive memory elements 310'(1)-310'(N) increases, so does the accuracy with which the mimic resistive memory 308' mimics the resistance (R) of the resistive memory 304'. Additionally, the total mimic resistance ($R_{total\_mimic}$) in this aspect is the average resistance of the mimic resistive memory elements 310'(1)-310'(N) in an anti-parallel (AP) state, as such resistance is typically a higher value than the resistance of a parallel (P) state. By employing the higher AP resistance for the total mimic resistance ($R_{total\_mimic}$), the generated mimic voltage ($V_{mimic}$) has a higher value that mimics the higher voltage condition of the resistive memory 304'(i.e., generates a voltage (V) that is more likely to approach a breakdown voltage (V(bd))).

With continuing reference to FIG. 6, to perform a mimic write operation, the mimic write current ($I_{W\_mimic}$) is applied to the mimic resistive memory 308' as a result of voltages applied to a mimic bit line 314' and a mimic source line 316'. During the write operation, a mimic word line 604 selects one of the mimic resistive memory elements 310'(1)-310'(4) to which the mimic write operation is performed via a corresponding access transistor 606(1)-606(4). However, because the mimic resistive memory elements 310'(1)-310'(4) are connected as previously described, an first voltage ($V_p$) is generated at a first node 318' of the mimic resistive memory 308', while a second voltage ($V_n$) is generated at a second node 320'. The first voltage ($V_p$) and the second voltage ($V_n$) are provided to a write driver control circuit 312'. The write driver control circuit 312' is configured to determine the mimic voltage ($V_{mimic}$) (i.e., mimic voltage ($V_{mimic}$)=first voltage ($V_p$)−second voltage ($V_n$)) and compare the mimic voltage ($V_{mimic}$) to the threshold voltage ($V_{threshold}$) bounded by the maximum threshold voltage ($V_{max\_threshold}$) and the minimum threshold voltage ($V_{min\_threshold}$). Based on this comparison, the write driver control circuit 312' is configured to adjust the write current ($I_W$) and the mimic write current ($I_{W\_mimic}$). In particular, the write driver control circuit 312' in this aspect is configured to adjust the write current ($I_W$) and the mimic write current ($I_{W\_mimic}$) by providing a write driver strength control signal (WDS [2:0]) and a mimic write driver strength control signal ($WDS_{mimic}$ [2:0]) to the writer driver 302' and the mimic write driver 306', respectively. As described in more detail below, the write driver control circuit 312' is also configured to receive a strength evaluation (str_eval), a reference voltage (Vref), a clock (clk), and an idle memory indicator (mem_idle) to aid in performing the above function.

With continuing reference to FIG. 6, each state of the write driver strength control signal (WDS [2:0]) corresponds to a given write current ($I_W$) level. In particular, the write driver 302' includes bit line inverters 608(1)-608(4) and source line inverters 610(1)-610(4). Each bit line inverter 608(1)-608(4) and each source line inverter 610(1)-610(4) also corresponds to a given write current ($I_W$) level. Thus, upon receiving the write driver strength control signal (WDS [2:0]) from the write driver control circuit 312', a given bit line inverter 608(1)-608(4) and a given source line inverter 610(1)-610(4) are configured to activate according to the corresponding state of the write driver strength control signal (WDS [2:0]). As non-limiting examples, in this aspect, if the write driver strength control signal (WDS [2:0]) activates the bit line inverter 608(1) and the source line inverter 610(1), the write current ($I_W$) will have a default write current ($I_W$) level. If the write driver strength control signal (WDS [2:0]) activates the bit line inverter 608(2) and the source line inverter 610(2), the write current ($I_W$) will have a write current ($I_W$) level increased by a factor of one (1). If the write driver strength control signal (WDS [2:0]) activates the bit line inverter 608(3) and the source line inverter 610(3), or the bit line inverter 608(4) and the source line inverter 610(4), the write current ($I_W$) will have a write current ($I_W$) level increased by a factor of two (2) or four (4), respectively. Further, a multiplexer 612 included in the write driver 302' selects to which column of the resistive memory 304' the write current ($I_W$) will be applied.

With continuing reference to FIG. 6, similar to the write driver strength control signal (WDS [2:0]), each state of the mimic write driver strength control signal ($WDS_{mimic}$ [2:0]) corresponds to a given write current ($I_W$) level. In this manner, the mimic write driver 306' includes mimic bit line inverters 614(1)-614(4) and mimic source line inverters 616(1)-616(4) similar to the bit line inverters 608(1)-608(4) and the source line inverters 610(1)-610(4) in the write driver 302'. Thus, upon receiving the mimic write driver strength control signal ($WDS_{mimic}$ [2:0]), a given mimic bit line inverter 614(1)-614(4) and a given mimic source line inverter 616(1)-616(4) are configured to activate according to the corresponding state of the mimic write driver strength control signal ($WDS_{mimic}$ [2:0]). The write current ($I_W$) level associated with each mimic bit line inverter 614(1)-614(4) and each mimic source line inverter 616(1)-616(4) is equal to the write current ($I_W$) level associated with each corresponding bit line inverter 608(0)-608(4) and source line inverter 610(0)-610(4), respectively. Further, although the mimic write driver 306' only employs one (1) column of mimic resistive memory elements 310'(1)-310'(4), the mimic write driver 306' includes a multiplexer 618 so as to fully mimic the voltage and timing characteristics of the write driver 302'. In this manner, the write driver adjustment circuit 300' is configured to adjust the write current ($I_W$) to a current level sufficient to perform write operations, but low enough to reduce or avoid breakdown in the resistive memory elements 602(1)-602(N).

Figure 7:
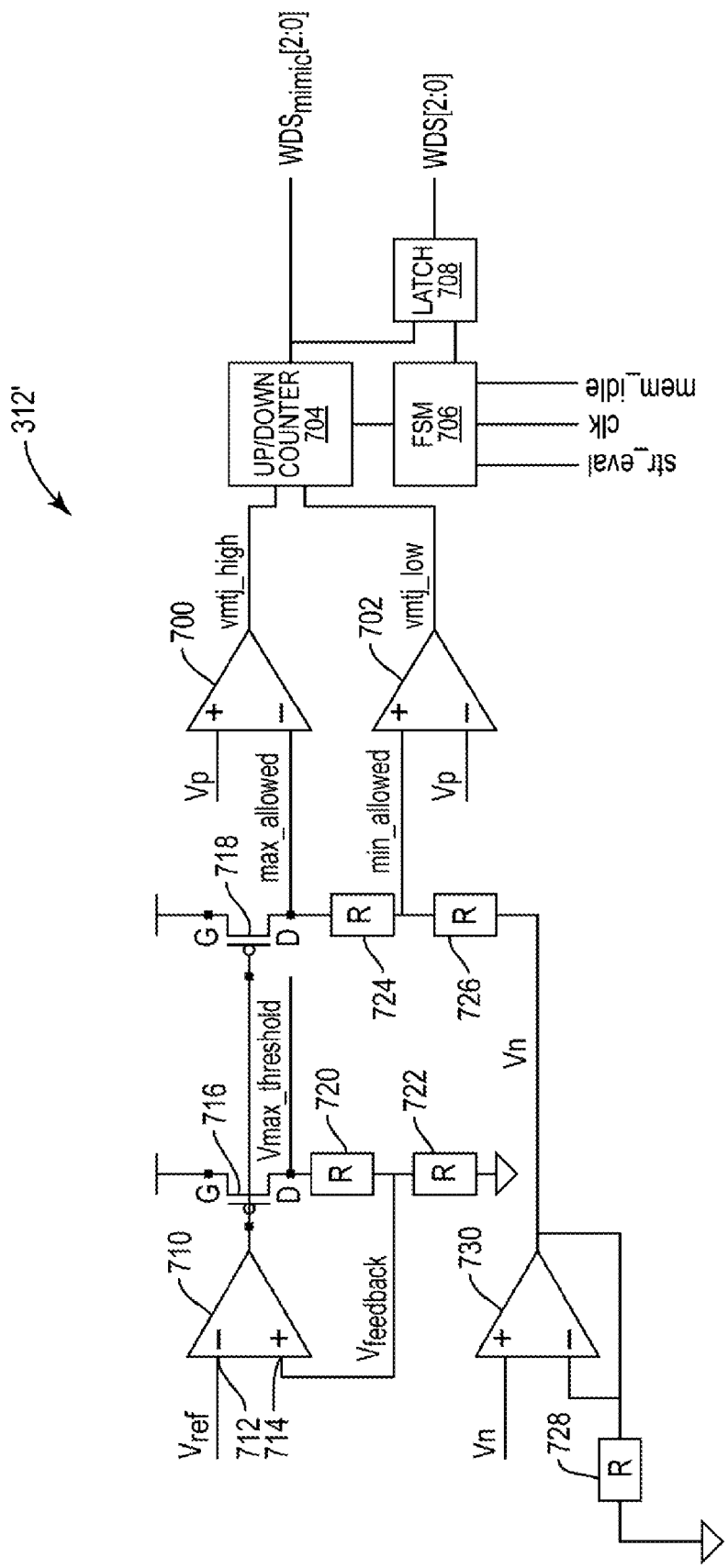
FIG. 7 is a diagram of an exemplary write driver control circuit that can be employed by the write driver adjustment circuit of FIG. 6 to adjust the write current ($I_W$) provided by the write driver to the MRAM to write data based on the mimic write operation.

In this regard, FIG. 7 illustrates an exemplary aspect of the write driver control circuit 312' in the write driver adjustment circuit 300' of FIG. 6. As previously described, the write driver control circuit 312' is configured to adjust the write current ($I_W$) and the mimic write current ($I_{W\_mimic}$) by providing a write driver strength control signal (WDS [2:0]) and a mimic write driver strength control signal ($WDS_{mimic}$ [2:0]) to the write driver 302' and the mimic write driver 306', respectively, of FIG. 6. In order to provide such signals, the write driver control circuit 312' is configured to compare the mimic voltage ($V_{mimic}$) (i.e., mimic voltage ($V_{mimic}$)=first voltage ($V_p$)−second voltage ($V_n$)), to the maximum threshold voltage ($V_{max\_threshold}$) and the minimum threshold voltage ($V_{min\_threshold}$). By making such a comparison, the write driver control circuit 312' may adjust the write current ($I_W$) to a level sufficient to write to the resistive memory 304, but low enough to reduce or avoid breakdown in the resistive memory 304.

With continuing reference to FIG. 7, to achieve this comparison, the write driver control circuit 312' is configured to compare the first voltage ($V_p$) to a maximum allowed voltage (max_allowed) and a minimum allowed voltage (min_allowed). The maximum allowed voltage (max_allowed) is equal to a sum of the maximum threshold voltage ($V_{max\_threshold}$) and the second voltage ($V_n$) (i.e., maximum allowed voltage (max_allowed)=maximum threshold voltage ($V_{max\_threshold}$)+second voltage ($V_n$)). The minimum allowed voltage (min_allowed) is equal to a sum of the minimum threshold voltage ($V_{min\_threshold}$) and the second voltage ($V_n$) (i.e., minimum allowed voltage (min_allowed)=minimum threshold voltage ($V_{min\_threshold}$)+second voltage ($V_n$)). Thus, comparing the first voltage ($V_p$) to the maximum allowed voltage (max_allowed) and the minimum allowed voltage (min_allowed) is equivalent to comparing the mimic voltage ($V_{mimic}$) to the maximum threshold voltage ($V_{max\_threshold}$) and the minimum threshold voltage ($V_{min\_threshold}$).

With continuing reference to FIG. 7, the write driver control circuit 312' includes a high voltage comparator 700 configured to receive the first voltage ($V_p$) and the maximum allowed voltage (max_allowed) across a resistive memory element 602(1)-602(N) of the resistive memory 304' of FIG. 6. If the first voltage ($V_p$) is higher than the maximum allowed voltage (max_allowed), a high indicator (vmtj_high) is activated. Conversely, if the first voltage ($V_p$) is lower than the maximum allowed voltage (max_allowed), the high indicator (vmtj_high) is not activated. The write driver control circuit 312' also includes a low voltage comparator 702 configured to receive the first voltage ($V_p$) and the minimum allowed voltage (min_allowed) across a resistive memory element 602(1)-602(N) of the resistive memory 304' of FIG. 6. If the first voltage ($V_p$) is lower than the minimum allowed voltage (min_allowed), a low indicator (vmtj_low) is activated. If the first voltage ($V_p$) is higher than the minimum allowed voltage (min_allowed), the low indicator (vmtj_low) is not activated. In this manner, because the first voltage ($V_p$) is used in both comparisons, the high indicator (vmtj_high) and the low indicator (vmtj_low) will not be activated simultaneously.

With continuing reference to FIG. 7, the high indicator (vmtj_high) and the low indicator (vmtj_low) are provided to an up/down counter 704. The up/down counter 704 is configured to decrement the write driver strength control signal (WDS [2:0]) and the mimic write driver strength control signal ($WDS_{mimic}$ [2:0]) if the high indicator (vmtj_high) is activated, as this indicates that the mimic voltage ($V_{mimic}$) is too high. Conversely, the up/down counter 704 is configured to increment the write driver strength control signal (WDS [2:0]) and the mimic write driver strength control signal ($WDS_{mimic}$ [2:0]) if the low indicator (vmtj_low) is activated, as this indicates that the mimic voltage ($V_{mimic}$) is too low. Notably, the up/down counter 704 is configured to receive the high indicator (vmtj_high) and the low indicator (vmtj_low) upon each mimic write operation, and thus may only increment or decrement the write driver strength control signal (WDS [2:0]) and the mimic write driver strength control signal ($WDS_{mimic}$ [2:0]) incrementally. Such an incremental adjustment prevents the write driver strength control signal (WDS [2:0]) and the mimic write driver strength control signal ($WDS_{mimic}$ [2:0]) from being adjusted by relatively large amounts if, for example, a mimic write operation produces an unusually high or low mimic voltage ($V_{mimic}$).

With continuing reference to FIG. 7, the write driver control circuit 312' also includes a finite state machine (FSM) 706 configured to control the operation of the up/down counter 704. The FSM 706 is configured to receive the strength evaluation (str_eval) and the clock (clk). In this manner, the FSM 706 enables the up/down counter 704, and thus an evaluation of the mimic voltage ($V_{mimic}$), each time the strength evaluation (str_eval) is activated. As non-limiting examples, the strength evaluation (str_eval) may be activated every one (1), five (5), or ten (10) seconds, depending on the frequency with which the design of the write driver adjustment circuit 300' adjusts the write current ($I_W$). A latch 708 in the write driver control circuit 312' is also controlled by the FSM 706. In particular, in this aspect, the write driver strength control signal (WDS [2:0]) is only adjusted when the resistive memory 304' is in an idle state. The memory idle (mem_idle) received by the FSM 706 indicates when the resistive memory 304' is in the idle state, thus allowing the FSM 706 to activate and deactivate the latch 708 according to the state of the resistive memory 304'. In this manner, the write driver strength control signal (WDS [2:0]) is updated only when the latch 708 is activated (i.e., when the resistive memory 304' is active) so as to not interfere with the operation of the resistive memory 304'.

With continuing reference to FIG. 7, the circuit elements used to generate the maximum threshold voltage ($V_{max\_threshold}$) and the minimum threshold voltage ($V_{min\_threshold}$) are now described. In particular, the maximum threshold voltage ($V_{max\_threshold}$) and the minimum threshold voltage ($V_{min\_threshold}$) are generated based on the reference voltage ($V_{ref}$). A reference comparator 710 is configured to receive the reference voltage ($V_{ref}$) on a first input 712 and receive a divided feedback voltage ($V_{feedback}$) on a second input 714. The reference comparator 710 is configured to provide its output to a gate (G) of a transistor 716 and a gate (G) of a transistor 718. A drain (D) of the transistor 716 is coupled to a resistor 720 serially connected to a resistor 722 that provides the divided feedback voltage ($V_{feedback}$) to the second input 714 of the reference comparator 710. The ratio of a resistance (R(720)) of the resistor 720 and a resistance (R(722)) of the resistor 722 is determined based on the equation (reference voltage ($V_{ref}$)=maximum threshold voltage ($V_{max\_threshold}$)*R(722)/(R(720)+R(722)). In this manner, the maximum threshold voltage ($V_{max\_threshold}$) is generated at the drain (D) of the transistor 716. Further, a drain (D) of the transistor 718 is coupled to a resistor 724 serially connected to a resistor 726. A sum of a resistance (R(724)) of the resistor 724 and a resistance (R(726)) of the resistor 726 equals the sum of the resistances (R(720)) and (R(722)) in this aspect. The resistance (R(724)) is determined by the equation (resistance (R(724))=(maximum threshold voltage ($V_{max\_threshold}$)–minimum threshold voltage ($V_{min\_threshold}$))/reference current ($I_{ref}$)), wherein the reference current ($I_{ref}$) is generated by providing the second voltage ($V_n$) to a resistor 728. In this manner, the ratio of the resistance (R(724)) and the resistance (R(726)) is configured so that the minimum allowed voltage (min_allowed) equals the sum of the minimum threshold voltage ($V_{min\_threshold}$) and the second voltage ($V_n$), as previously described. Notably, the resistor 728, along with the second voltage ($V_n$) is coupled to a buffer 730 configured to provide a buffered first voltage ($V_n$) to the resistor 726.

Figure 8:
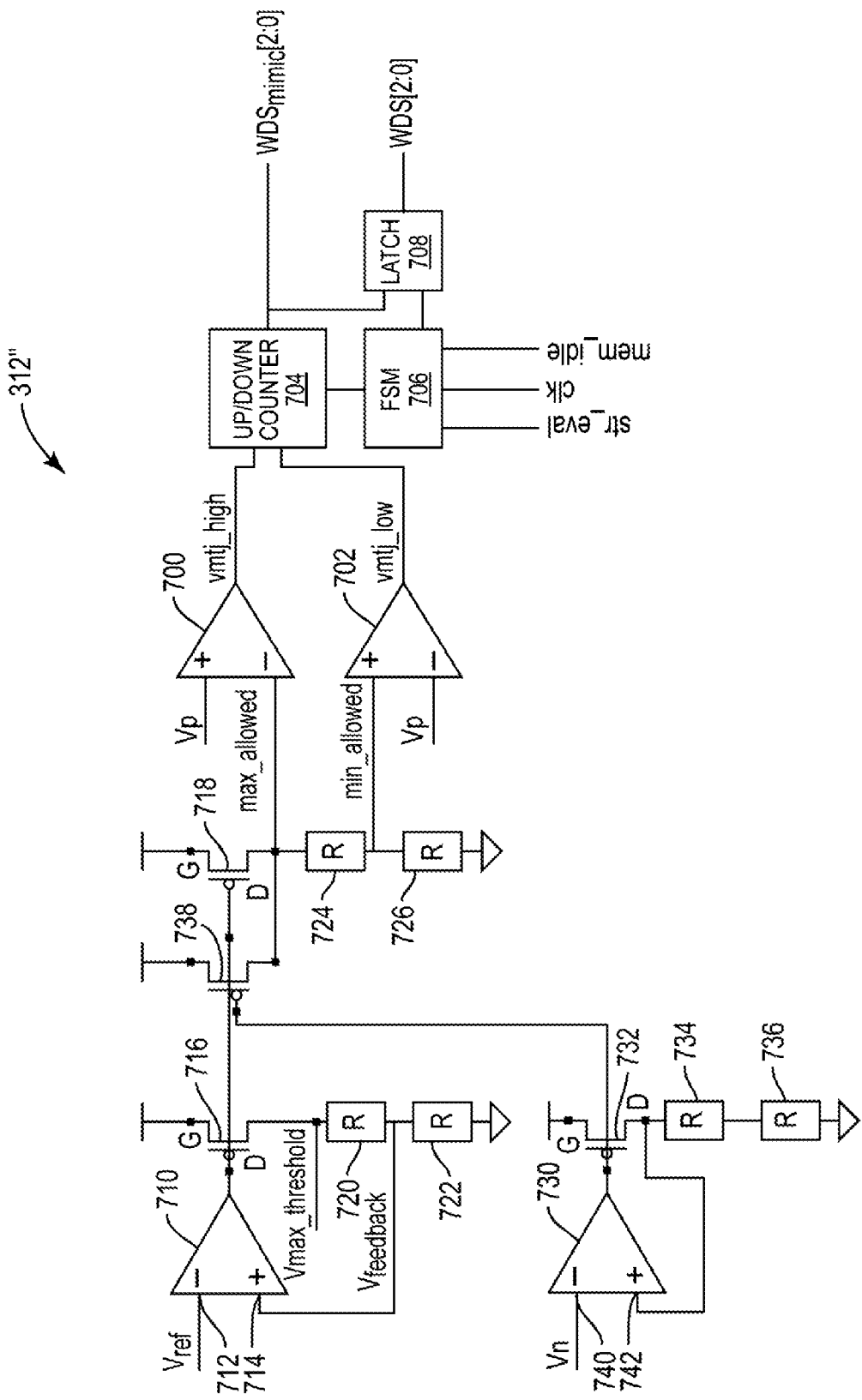
FIG. 8 is a diagram of another exemplary write driver control circuit that can be employed by the write driver adjustment circuit of FIG. 6 to adjust the write current ($I_W$) provided by the write driver to the MRAM to write data based on the mimic write operation.

Other write driver control circuits can be provided in the write driver adjustment circuit 300' in FIG. 6 to adjust the write current ($I_W$) to a level sufficient to perform write operations in the resistive memory 304', but low enough to reduce or avoid breakdown. In this regard, FIG. 8 illustrates another exemplary write driver control circuit 312" that varies in design from the write driver control circuit 312' of FIG. 7. Notably, the write driver control circuit 312" includes certain components in common with the write driver control circuit 312' of FIG. 7, which are not re-described herein. Circuit elements included in the write driver control circuit 312" that are not found in the write driver control circuit 312' of FIG. 7 include a transistor 732, a resistor 734, a resistor 736, and a transistor 738. In particular, the output of the buffer 730 is coupled to a gate (G) of the transistor 732 and to a gate (G) of the transistor 738. A drain (D) of the transistor 732 is coupled to the resistor 734 serially connected to the resistor 736. Notably, the resistance (R(734)) of the resistor 734 is equivalent to the resistance (R(720)) of the resistor 720, while the resistance (R(736)) of the resistor 736 is equivalent to the resistance (R(722)) of the resistor 722. The second voltage ($V_n$) is coupled to a first input 740 of the buffer 730, while the drain (D) of the transistor 732 is coupled to a second input 742 of the buffer 730. Further, a drain (D) of the transistor 738 is coupled to the drain (D) of the transistor 718. The write driver control circuit 312" is configured to generate and provide the maximum allowed voltage (max_allowed) and the minimum allowed voltage (min_allowed) to the high voltage comparator 700 and the low voltage comparator 702, respectively. Because of the alternative circuit elements in the write driver control circuit 312", such voltages are generated differently as compared to the write driver control circuit 312'. However, the designs of both the write driver control circuit 312' of FIG. 7 and the write driver control circuit 312" of FIG. 8 provide the necessary function for the write driver adjustment circuit 300' to properly adjust the write driver strength control signal (WDS [2:0]) and the mimic write driver strength control signal ($WDS_{mimic}$ [2:0]) according to the aspects described herein.

Figure 9:
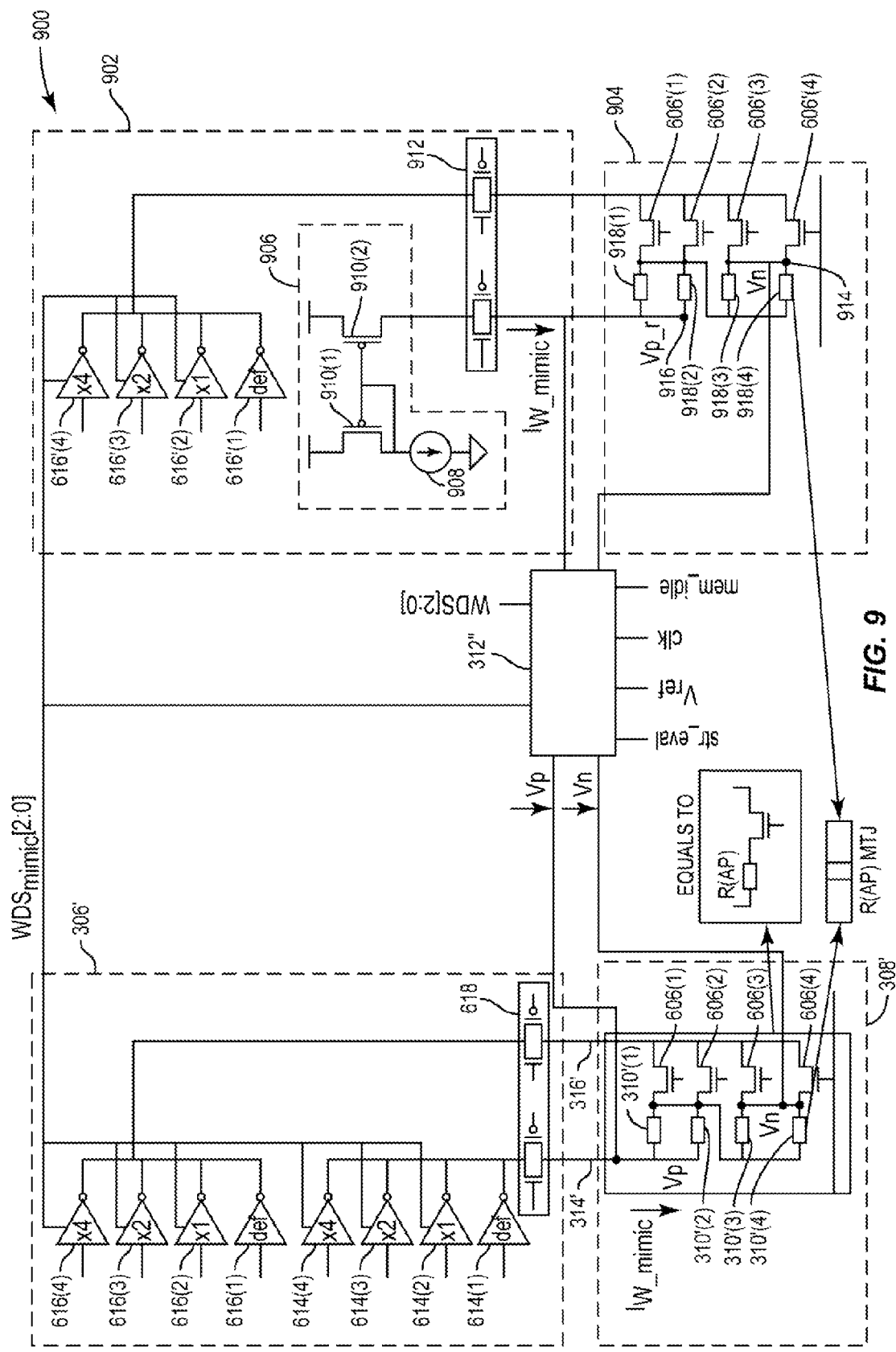
FIG. 9 is a diagram of another exemplary write driver adjustment circuit configured adjust a write current ($I_W$) provided by a write driver to an MRAM to write data based on two mimic write operations performed in two mimic MRAMs so as to reduce write failures of a corresponding MRAM memory due to breakdown.

In addition to the write driver adjustment circuit 300' of FIG. 6 configured to generate the minimum threshold voltage ($V_{min\_threshold}$) as described in the write driver control circuits 312', 312" of FIGS. 7 and 8, respectively, other aspects may be configured to generate the minimum threshold voltage ($V_{min\_threshold}$) in alternative ways. In this regard, FIG. 9 illustrates a write driver adjustment circuit 900. The write driver adjustment circuit 900 includes certain components in common with the write driver adjustment circuit 300' of FIG. 6, which are not re-described herein. In this manner, the write driver adjustment circuit 900 includes a minimum mimic write driver 902 in addition to the mimic write driver 306' of FIG. 6. The minimum mimic write driver 902 is configured to provide a minimum write current ($I_{Wmin}$) (i.e., switching current) required to perform a write operation in a minimum mimic resistive memory 904 that is similar to the mimic resistive memory 308' of FIG. 6. The minimum mimic write driver 902 includes source line inverters 616' (1)-616' (4) configured to receive the mimic write driver strength control signal ($WDS_{mimic}$ [2:0]) similar to the source line inverters 616(1)-616(4) of FIG. 6. A current generator 906 employs a current source 908 and two transistors 910(1), 910(2) to generate the minimum write current ($I_{Wmin}$). The minimum write current ($I_{Wmin}$) passes through a multiplexer 912 similar to the multiplexer 618 in the mimic write driver 306' of FIG. 6 so as to fully mimic the voltage and timing characteristics of the writer driver 302' of FIG. 6. In this manner, the minimum write current ($I_{Wmin}$) is provided to the minimum mimic resistive memory 904. Similar to the mimic resistive memory 308' of FIG. 6, the minimum mimic resistive memory 904 is configured to generate the second voltage ($V_n$) at a final node 914. However, rather than generating the first voltage ($V_p$), the minimum mimic resistive memory 904 is configured to generate a minimum first voltage ($V_{p\_r}$) at an initial node 916 representative of the voltage (V) across mimic resistive memory elements 918(1)-918(4), each of which is coupled to an access transistor 606'(1)-606'(4) similar to the access transistors 606(1)-606(4) of FIG. 6. In this manner, a write driver control circuit 312''' may use the minimum first voltage ($V_{p\_r}$) when determining whether the write driver strength control signal (WDS [2:0]) and the mimic write driver strength control signal ($WDS_{mimic}$ [2:0]) need increasing, rather than relying on the minimum allowed voltage (min_allowed) generated using circuit elements in the write driver control circuits 312', 312" of FIGS. 7 and 8, respectively.

Figure 10:
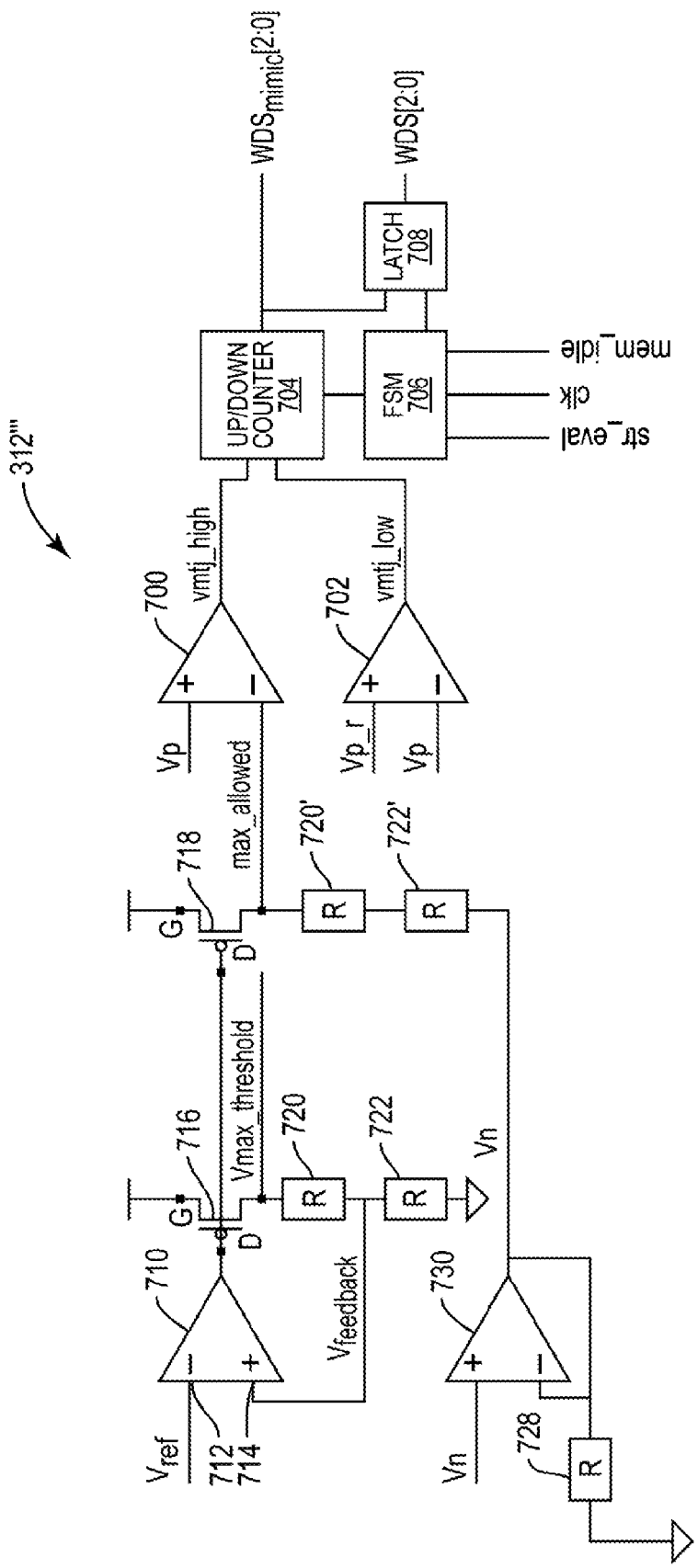
FIG. 10 is a diagram of an exemplary write driver control circuit employed by the write driver adjustment circuit of FIG. 9.

In this regard, FIG. 10 illustrates an exemplary aspect of the write driver control circuit 312''' in the write driver adjustment circuit 900 of FIG. 9. Notably, the write driver control circuit 312''' includes certain components in common with the write driver control circuit 312' of FIG. 7, which are not re-described herein. Because the write driver control circuit 312''' employs the minimum first voltage ($V_{p\_r}$) instead of relying on the minimum allowed voltage (min_allowed), the write driver control circuit 312''' does not employ the resistors 724, 726 for voltage division. In particular, the resistors 724, 726 are used to generate the minimum allowed voltage (min_allowed) in the write driver control circuit 312' of FIG. 7, as previously described. However, the minimum first voltage ($V_{p\_r}$) is provided to the low voltage comparator 702, as opposed to the minimum allowed voltage (min_allowed). Because the resistors 724, 726 are not for voltage division, the write driver control circuit 312''' may employ resistors 720', 722', which are similar to the resistors 720, 722. In this manner, by employing the minimum first voltage ($V_{p\_r}$) rather than generating the minimum allowed voltage (min_allowed), the write driver control circuit 312''' may adjust the write current ($I_W$) based on the actual minimum required current ($I_{W\_min}$), rather than making such an adjustment based on the calculated minimum allowed voltage (min_allowed).

Adjusting resistive memory write driver strength based on a mimic resistive memory write operation according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 11:
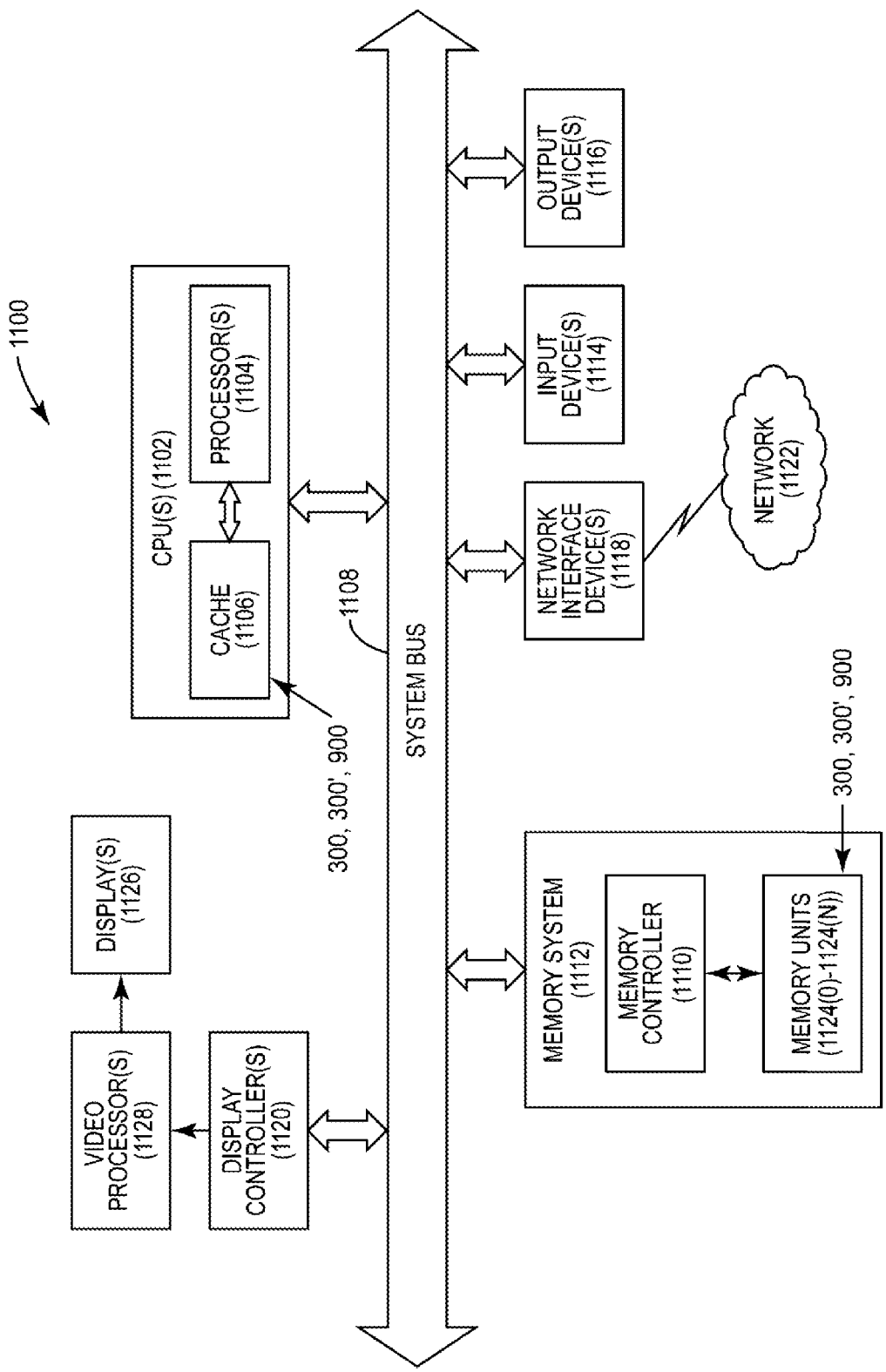
FIG. 11 is a block diagram of an exemplary processor-based system that can include the write driver adjustment circuits of FIGS. 3, 6, and 9.

In this regard, FIG. 11 illustrates an example of a processor-based system 1100 that can employ the write driver adjustment circuits 300, 300', and 900 illustrated in FIGS. 3, 6, and 9, respectively. In this example, the processor-based system 1100 includes one or more central processing units (CPUs) 1102, each including one or more processors 1104. The CPU(s) 1102 may have cache memory 1106 coupled to the processor(s) 1104 for rapid access to temporarily stored data. The cache memory 1106 may employ the write driver adjustment circuits 300, 300', and 900 illustrated in FIGS. 3, 6, and 9, respectively. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including but not limited to input keys, switches, voice processors, etc. The output device(s) 1116 can include any type of output device, including but not limited to audio, video, other visual indicators, etc. The network interface device(s) 1118 can be any devices configured to allow exchange of data to and from a network 1122. The network 1122 can be any type of network, including but not limited to a wired or wireless network, a private or public network, a local area network (LAN), a wide local area network (WLAN), and the Internet. The network interface device(s) 1118 can be configured to support any type of communications protocol desired. The memory system 1112 can include one or more memory units 1124(0)-1124(N) that may employ the write driver adjustment circuits 300, 300', and 900 illustrated in FIGS. 3, 6, and 9, respectively.

The CPU(s) 1102 may also be configured to access the display controller(s) 1120 over the system bus 1108 to control information sent to one or more displays 1126. The display controller(s) 1120 sends information to the display(s) 1126 to be displayed via one or more video processors 1128, which process the information to be displayed into a format suitable for the display(s) 1126. The display(s) 1126 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A write driver adjustment circuit for adjusting a write current for a resistive memory, comprising:
   a mimic write driver circuit configured to provide a mimic write current mimicking the write current provided by a write driver to the resistive memory;
   a mimic resistive memory having a mimic resistance corresponding to a resistance of the resistive memory; and
   a write driver control circuit configured to:
      determine a mimic voltage generated across the mimic resistive memory in response to the mimic resistive memory receiving the mimic write current;
      compare the determined mimic voltage to a threshold voltage; and
      adjust the write current provided by the write driver to the resistive memory based on the comparison of the mimic voltage to the threshold voltage.

2. The write driver adjustment circuit of claim 1, wherein the threshold voltage is equal to a breakdown voltage that, when present across a resistive memory element in the resistive memory, prevents the resistive memory element from storing a data value.

3. The write driver adjustment circuit of claim 1, wherein the threshold voltage is in a range of a maximum threshold voltage and a minimum threshold voltage, wherein voltages greater than the maximum threshold voltage and less than the minimum threshold voltage correspond to the write current that causes a write failure in the resistive memory.

4. The write driver adjustment circuit of claim 3, wherein the write driver control circuit is configured to adjust the write current by being configured to decrease the write current if the mimic voltage is greater than the maximum threshold voltage based on a reference voltage.

5. The write driver adjustment circuit of claim 3, wherein the write driver control circuit is configured to adjust the write current by being configured to increase the write current if the mimic voltage is less than the minimum threshold voltage based on a reference voltage.

6. The write driver adjustment circuit of claim 1, wherein the write driver control circuit is further configured to adjust the mimic write current provided by a mimic write driver to the mimic resistive memory based on the comparison of the mimic voltage to the threshold voltage.

7. The write driver adjustment circuit of claim 6, wherein the write driver control circuit is configured to adjust the mimic write current by being configured to provide a mimic write driver strength control signal to the mimic write driver.

8. The write driver adjustment circuit of claim 1, wherein the write driver control circuit is configured to adjust the write current by being configured to provide a write driver strength control signal to the write driver.

9. The write driver adjustment circuit of claim 1, wherein the mimic resistive memory comprises a plurality of mimic resistive memory elements.

10. The write driver adjustment circuit of claim 9, wherein the plurality of mimic resistive memory elements is configured so that the mimic resistance of the plurality of mimic resistive memory elements is approximately equal to an average resistance of the plurality of mimic resistive memory elements.

11. The write driver adjustment circuit of claim 1, wherein the write driver control circuit is further configured to update the write current if the resistive memory is in an idle state.

12. The write driver adjustment circuit of claim 1, wherein the write driver control circuit is configured to determine the mimic voltage by being configured to determine a difference of a first voltage at a first node of the mimic resistive memory and a second voltage at a second node of the mimic resistive memory.

13. The write driver adjustment circuit of claim 12, wherein the write driver control circuit is further configured to:
   receive the first voltage from the first node of the mimic resistive memory; and
   receive the second voltage from the second node of the mimic resistive memory.

14. The write driver adjustment circuit of claim 13, wherein:
   the write driver control circuit is further configured to:
      generate a maximum threshold voltage and a minimum threshold voltage based on a reference voltage;
      provide a write driver strength control signal to the resistive memory based on a high indicator and a low indicator; and
      provide a mimic write driver strength control signal to the mimic resistive memory based on the high indicator and the low indicator; and
   the write driver control circuit comprises:
      a buffer configured to provide the second voltage received from the second node of the mimic resistive memory;
      a high voltage comparator configured to:
         compare the first voltage to a maximum allowed voltage equal to a sum of the maximum threshold voltage and the second voltage; and
         provide the high indicator indicative of whether the first voltage exceeds the maximum allowed voltage; and
      a low voltage comparator configured to:
         compare the first voltage to a minimum allowed voltage equal to a sum of the minimum threshold voltage and the second voltage; and
         provide the low indicator indicative of whether the first voltage exceeds the minimum allowed voltage.

15. The write driver adjustment circuit of claim 14, further comprising:
   a minimum mimic write driver circuit configured to provide a minimum write current to perform a write operation in a minimum mimic resistive memory; and
   the minimum mimic resistive memory configured to provide a minimum first voltage from a first node of the minimum mimic resistive memory.

16. The write driver adjustment circuit of claim 15, wherein the low voltage comparator is further configured to:
   compare the first voltage to the minimum first voltage; and
   provide the low indicator indicative of whether the first voltage exceeds the minimum first voltage.

17. The write driver adjustment circuit of claim 1, wherein the mimic resistive memory comprises a plurality of mimic resistive memory elements, wherein each mimic resistive memory element of the plurality of mimic resistive memory elements comprises a magnetic tunnel junction (MTJ).

18. The write driver adjustment circuit of claim 1 integrated into an integrated circuit (IC).

19. The write driver adjustment circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

20. A write driver adjustment circuit for adjusting a write current for a resistive memory, comprising:
  a means for providing a mimic write current that mimics the write current provided by a write driver to the resistive memory to a mimic resistive memory to perform a mimic write operation;
  a means for determining a mimic voltage generated across the mimic resistive memory in response to the mimic resistive memory receiving the mimic write current;
  a means for comparing the mimic voltage to a threshold voltage; and
  a means for adjusting the write current provided by the write driver to the resistive memory based on comparing the mimic voltage to the threshold voltage.

21. A method of adjusting a write driver current to reduce a breakdown failure rate of a corresponding resistive memory system, comprising:
  providing a mimic write current that mimics a write current provided by a write driver to a resistive memory to a mimic resistive memory;
  determining a mimic voltage generated across the mimic resistive memory in response to the mimic resistive memory receiving the mimic write current;
  comparing the mimic voltage to a threshold voltage; and
  adjusting the write current provided by the write driver based on comparing the mimic voltage to the threshold voltage.

22. The method of claim 21, further comprising adjusting the mimic write current provided by a mimic write driver based on comparing the mimic voltage to the threshold voltage.

23. The method of claim 21, wherein adjusting the write current provided by the write driver comprises decreasing the write current if the mimic voltage is greater than a maximum threshold voltage based on a reference voltage.

24. The method of claim 21, wherein adjusting the write current provided by the write driver comprises increasing the write current if the mimic voltage is less than a minimum threshold voltage based on a reference voltage.

25. The method of claim 21, further comprising updating the write current if the resistive memory is in an idle state.

26. A magnetic random access memory (MRAM) system comprising:
  an MRAM memory;
  a write driver configured to provide a write current to the MRAM memory; and
  a write driver adjustment circuit comprising:
    a mimic write driver circuit configured to provide a mimic write current mimicking the write current provided by the write driver to the MRAM memory;
    a mimic resistive memory having a mimic resistance corresponding to a resistance of the MRAM memory; and
    a write driver control circuit configured to:
      determine a mimic voltage generated across the mimic resistive memory in response to the mimic resistive memory receiving the mimic write current;
      compare the determined mimic voltage to a threshold voltage; and
      adjust the write current provided by the write driver to the MRAM memory based on the comparison of the mimic voltage to the threshold voltage.

* * * * *